United States Patent [19]

Jett, Jr.

[11] 3,973,221
[45] Aug. 3, 1976

[54] VOLTAGE CONTROLLED CRYSTAL OSCILLATOR APPARATUS

[75] Inventor: William B. Jett, Jr., Mesa, Ariz.

[73] Assignee: Motorola, Inc., Chicago, Ill.

[22] Filed: Apr. 7, 1975

[21] Appl. No.: 565,331

[52] U.S. Cl. .............................. 331/116 R; 331/20; 331/34; 331/177 R
[51] Int. Cl.² ........................ H03B 3/04; H03B 5/36
[58] Field of Search ........ 331/34, 20, 116 R, 177 R; 307/262; 328/155; 358/17, 25, 40

[56] References Cited
UNITED STATES PATENTS

| | | | |
|---|---|---|---|
| 3,691,475 | 9/1972 | Mouri et al. | 331/20 X |
| 3,763,439 | 10/1973 | Peil | 331/20 X |
| 3,806,634 | 4/1974 | Abbott et al. | 358/25 |

Primary Examiner—Siegfried H. Grimm
Attorney, Agent, or Firm—Michael D. Bingham; Harry M. Weiss

[57] ABSTRACT

A voltage controlled crystal oscillator is disclosed suitable to be included in a subcarrier regeneration stage for a color television receiver. The oscillator includes a novel phase shifting network in the feedback loop thereof for maintaining the oscillator in phase synchronism with a received NTSC reference burst signal. The phase shifting network comprises a first differential amplifier being adapted to receive a voltage oscillation signal having a 90° phase lag with respect to the oscillation signal generated by the crystal. The differential outputs from the first differential amplifier are respectively connected to the common terminal of a second differential amplifier and to a phase shifting circuit. The output of the phase shifting circuit is a first current signal having a predetermined phase relation to the input signal applied thereto. The output of the second differential amplifier is a second current signal having a predetermined phase which is related to the first current signal, the magnitude of the second current signal being controlled by a phase detector output voltage control signal which is applied to the second differential amplifier. A summing circuit is provided which is responsive to the first and second phase related current signals for generating a feedback signal having a phase which may be varied over a predetermined range in response to the gain of the second differential amplifier being varied by the phase detector control voltage. The feedback signal from the summing circuit is applied to the crystal thereby ensuring the correct loop gain and phase shift is maintained for oscillation. Moreover, suppression of third overtone oscillation of the crystal is provided without a tuned circuit.

11 Claims, 4 Drawing Figures

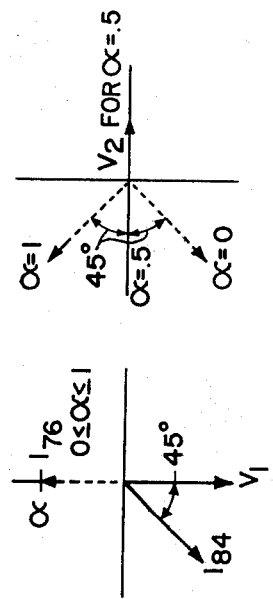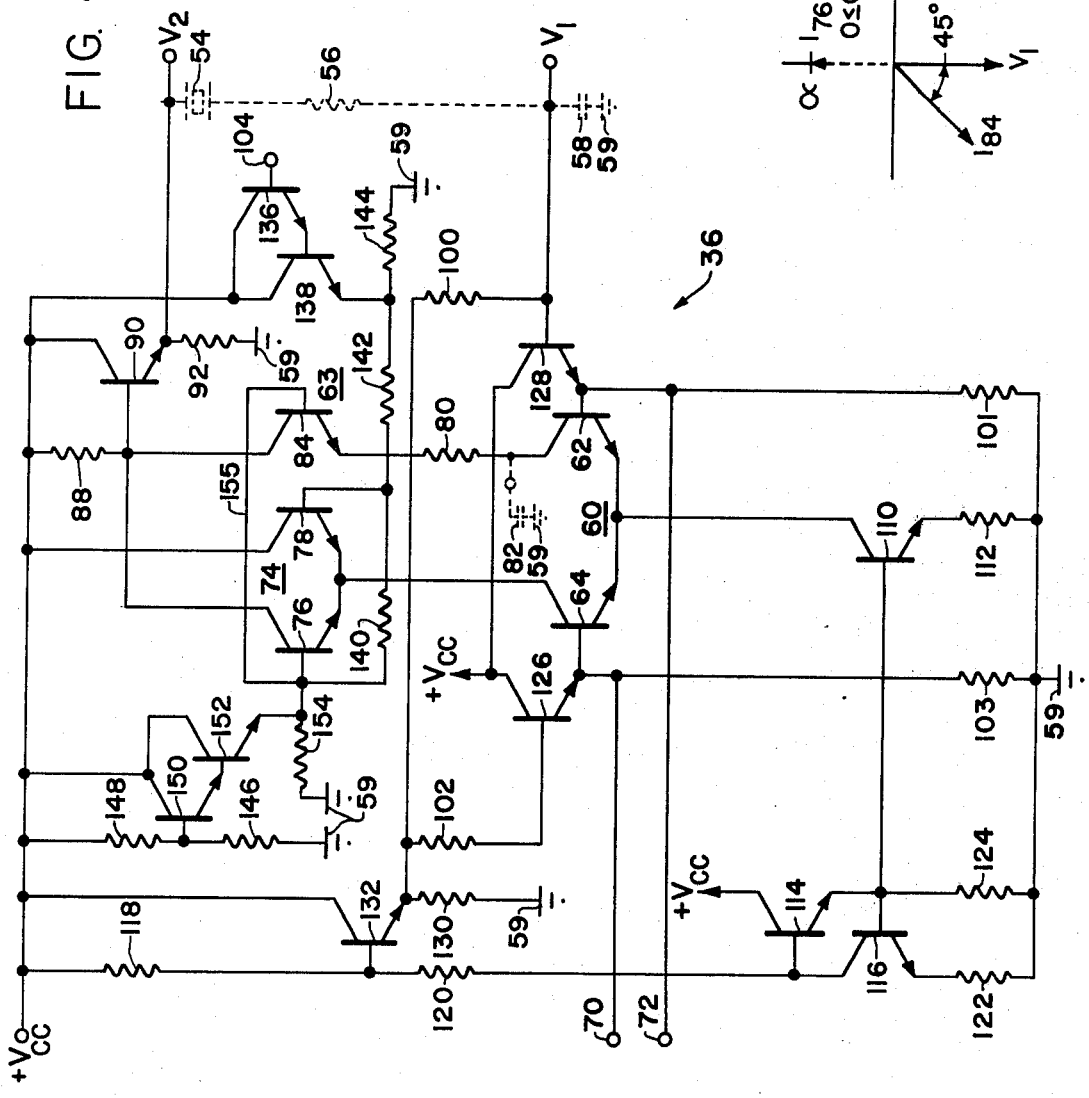

VOLTAGE CONTROLLED CRYSTAL OSCILLATOR APPARATUS

BACKGROUND OF THE INVENTION

The present invention relates to improvements in color television receivers and more particularly, to an improved voltage controlled crystal oscillator suitable to be provided in the phase lock loop system of the subcarrier regeneration stage thereof.

In the manufacture of electronic devices such as television receivers, it is desirable to utilize solid-state components to the greatest extent possible in order to realize the advantages inherent in such components.

In accordance with present NTSC standards governing television transmission signals luminance information, representing brightness variations in the reproduced televised image is received on an amplitude modulated main carrier signal. The chrominance information, representing color hue is received on an amplitude modulated 3.58 megahertz subcarrier signal. As is known in the art, the chrominance signal is demodulated in a chrominance demodulator stage such that color control signals are established and applied to the television picture tube thereby reproducing the transmitted image which has correct hue and color characteristics.

The aforementioned synchronous demodulators which respond to the chrominance signal require for their operation; a reference signal which is phase and frequency synchronized to the modulated subcarrier component of the chrominance signal, utilizing reference burst of the subcarrier component which is transmitted at reoccuring time intervals during the transmitted signal for purposes of synchronization. In some prior art circuits the chrominance signal is applied to a phase lock loop system comprising an automatic phase control (APC) detector, and a stable oscillator circuit. One output of the aforementioned oscillator is provided to a hue control circuit which provides a synchronous output signal to the chrominance demodulator network having correct phase information to thereby demodulate the chrominance signal through a matrix, as is understood in the art, which ensures the correct color signals will be supplied to the television tube. As is understood in the art, the output of the oscillator is also provided to a automatic chrominance control (ACC) detector.

One difficulty encountered in prior art demodulator systems relates to the oscillator which is used for providing the 3.58 reference signal in response to the reference sync burst. One particular problem associated with the crystal control oscillator utilized in some prior art systems is that it will occasionally oscillate at the third overtone of the fundamental frequency of the crystal. If the oscillator should oscillate at the third overtone frequency of the crystal, in some television sets a signal will be generated by automatic chrominance control detector for inhibiting the color signal. Hence the viewer would be restricted to seeing a black and white picture. To prevent oscillation at the third overtone frequency, prior art oscillators sometimes have discrete components forming a parallel resonant circuit which has a low impedance at the third overtone frequency. Thus, a trap is provided for the third overtone frequency preventing oscillation to be sustained thereat, as is known in the art. However, because the trap circuit adds components to the television receiver, increased cost are incurred which are borne by the consumer.

Therefore, a need exists to develop a voltage controlled crystal oscillator providing a solution to the problem of overcoming third overtone oscillation which seriously affects the stability and operation of a color television receiver without the need for discrete components which increase production costs for the television receiver.

SUMMARY OF THE INVENTION

Accordingly, it is an object of this invention to provide an improved voltage controlled crystal oscillator.

It is another object of this invention to provide an improved phase shifting circuit.

It is still a further object of this invention to provide an improved voltage controlled crystal oscillator including a variable phase shifting network.

It is still another object of this invention to provide an improved voltage controlled crystal oscillator which does not oscillate at the third overtone of the crystal frequency and does not require discrete components for filtering the third overtone frequency.

It is another object of this invention to provide a stable voltage controlled crystal oscillator suitable to be fabricated in monolithic integrated circuit form.

It is additional object of the invention to provide a monolithic integrated circuit voltage controlled crystal oscillator suitable to be provided in a color television receiver for supplying a continuous wave 3.58 megahertz reference signal to the chrominance demodulator of the color television receiver.

The voltage controlled crystal oscillator configuration and method of providing a feedback signal having a varying phase for sustaining oscillation are suitable for providing a 3.58 megahertz reference signal in response to a received reference sync burst which is available from the chrominance signal. Moreover, the oscillator circuit provides suppression of third overtone oscillation by the oscillator. The oscillator circuit includes a variable phase shifting network for providing an adjustable degree of phase shift to an applied input signal. The variable phase shifting network comprises a circuit for deriving from the input signal a pair of output currents which are 180° out of phase with respect to each other. An amplifier circuit receives a first one of the output phased currents at a common terminal thereof, the amplifier circuit having two input terminals and at least one output terminal; the magnitude of the received current signal being varied in response to a control voltage applied to one input terminal thereof which varies the gain of the amplifier circuit, the second input terminal of the amplifier circuit having a fixed bias voltage applied thereto. A phase shifting circuit is provided that is responsive to the second output phased current signal and the fixed bias voltage signal for providing an output current therefrom which has a predetermined phase relation to the received current signal. A summing circuit coupled between the output of the amplifier circuit and the phase shifting network derives an output current signal having a predetermined phase relation to the input signal, the phase of said output signal of the summing network being varied over a predetermined range in response to the controlled voltage varying the gain of the amplifier circuit. The voltage controlled crystal oscillator of the invention provides suppression of the third overtone frequency for enhancing the oscillators frequency stability characteristics.

BRIEF DESCRIPTION OF THE DRAWINGS

FIG. 3 is a vector diagram useful for understanding the phase shifting technique of the embodiment of the invention; and FIG. 4 is a schematic diagram illustrating the complete voltage controlled crystal oscillator including the phase shifting feedback network of the embodiment of the invention.

DETAILED DESCRIPTION OF THE PREFERRED EMBODIMENT

Figure 1:
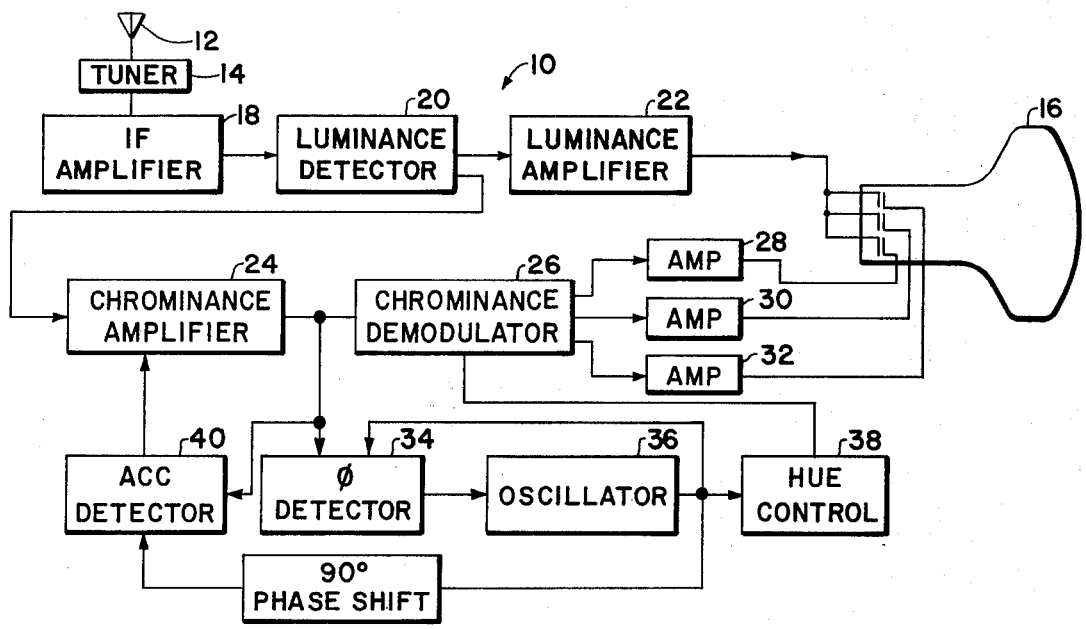
FIG. 1 is a block diagram of a color television receiver including a voltage control crystal oscillator of the embodiment of the invention.

Color television receivers are well known in the art, thus only a brief description of the structure of the circuitry pertinent to the subject invention is required. Referring to FIG. 1, there is shown a partial block diagram of a conventional color television receiver 10. Receiver 10 is coupled to a suitable antenna 12 to receive a composite signal that has been transmitted. The composite signal received by antenna 12 is applied to tuner 14 which includes conventional radio frequency amplifying and heterodyning stages for translating the signal to an intermediate frequency. The audio portion of the received signal is directed to a sound system (not shown) which demodulates and amplifies the usual 4.5 megahertz sound subcarrier signal to drive an audio speaker (also not shown). Also not shown, are the conventional vertical and horizontal deflection circuits which drive the deflection yoke of the three beam color cathode ray tube 16. The intermediate frequency signal from tuner 14 is then amplified by IF amplifier 18 and is applied to luminance detector 20. Luminance and chrominance information in the form of a composite video signal is derived in luminance detector 20 wherein the luminance component of the composite signal is amplified by luminance amplifier 22 and applied to the three cathodes of cathode ray tube 20, as is understood.

The chrominance components of the composite video frequency output signal of luminance detector 20 are applied to chrominance amplifier 24, which includes circuitry as is understood in the art for developing a chrominance signal which is then applied to chrominance demodulator 26. Chrominance demodulator 26 is a known form of synchronous demodulator preferrably constructed in monolithic integrated circuit form. Chrominance amplifier 24 also provides the chrominance signal to a phase lock loop system. As will be explained the phase lock loop system develops a 3.58 megahertz reference signal which is applied to chrominance demodulator 26. In response to the concurrent application of the 3.58 megahertz reference signal, having a phase and frequency which is synchronized to the NTSC modulated subcarrier component of the received composite signal, and the chrominance signal from chrominance amplifier 24, chrominance demodulator 26 functions to provide three color signals in the form of R-Y, G-Y and B-Y. The color control signals from chrominance demodulator 26 then are applied to individual ones of three identical color different signal amplifiers 28, 30 and 32 wherein they are amplified and applied to the control grids of the red, green and blue guns of cathode ray tube 16. As is known in the art the color different signals are matrixed with the luminance signal contained in the composite signal for providing the modulation of the three electron beams of cathode ray tube 16 as required for the reproduction of images having their natural color.

To generate the continuous wave reference signal having the same phase as the burst signal contained in the composite signal there is included in the receiver a phase lock loop system comprising automatic phase control (APC) phase detector 34, and crystal oscillator 36. APC detector 34 receives the chrominance signal from chrominance amplifier 24 for synchronizing oscillator 36 to the received sync burst signals. Hue control 38 in the form of a voltage controlled phase shift network varies the phase of the 3.58 megahertz reference signal applied from oscillator 36 for driving the synchronous chrominance demodulator 26, as is well understood in the art. Oscillator 36 also provides the 3.58 megahertz reference signal to ACC detector 40 which generates a ACC voltage for adjusting the gain of the chrominance amplifier 24 to maintain a proper chrominance signal output level therefrom.

Due to process variations, crystal oscillator 36 having a preferred monolithic integrated circuit form, could have sufficient gain and internal phase feedback that in some manufactured television receivers, oscillation could occur at the third overtone frequency of the crystal. To prevent television receivers from having this problem, the manufacturer of the television receiver has had to pretest the television sets and selectively correct the aforementioned problem. If this problem is not corrected, i.e., if the oscillator should have an output frequency at the third overtone of the crystal, the automatic chrominance control detector would provide for reducing the gain of chrominance amplifier 24 such that color information could not be demodulated, thereby suppressing color reproduction in the cathode ray tube. In some instances, to correct the aforementioned problem, television manufacturers have included an additional discrete circuit at the output of the oscillator for trapping the third overtone frequency. Thus, the oscillator is ensured of oscillating only at the fundamental frequency of the crystal. However, this results in additional cost to the consumer because of the production cost involved to eliminate the undesired third overtone oscillation problem.

Figure 2:
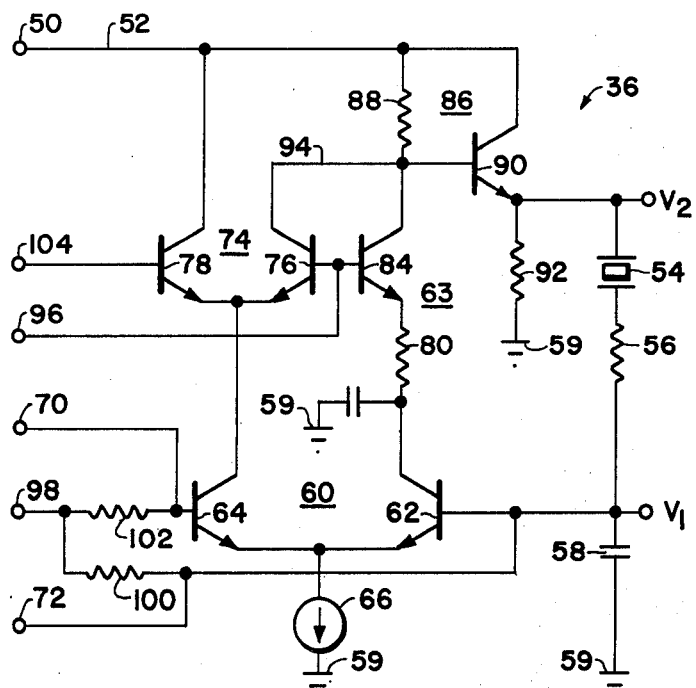
FIG. 2 is a simplified schematic diagram illustrating the voltage control crystal oscillator including the variable phase feedback network of the embodiment of the invention.

FIG. 2 illustrates a crystal oscillator of the embodiment of the invention having an improved phase shifting network for eliminating the preceding problem and which could replace oscillator 36 of present television receivers. Bias voltage is applied to oscillator 36 at terminal 50 over power supply line 52. To achieve frequency stability, oscillator 36 includes crystal 54 which has a resonant fundamental frequency at 3.58 megahertz. Connected in series with crystal 54 are resistor 56 and capacitor 58 which are coupled to a ground reference terminal 59. The 3.58 megahertz oscillator comprises differential amplifier 60 including transistors 62 and 64 coupled in tandem at their interconnected emitter electrodes to a constant current source 66 to ground reference terminal 59. To maintain oscillations at the desired frequency, a novel phase shifting network 63 is coupled between the outputs of differential amplifier 60 and crystal 54. The differential oscillation signal is provided at output terminals 70 and 72 at the base electrodes of transistor pair 62 and 64 of differential amplifier 60. Phase shifting network 63 includes a second differential amplifier 74 including transistor pairs 76 and 78, which have their interconnected emitter electrodes connected to the collector of transistor 64 of differential amplifier 60. The collector electrode of transistor 62 of differential amplifier 60 is connected to a phase shifting network comprising resistor 80 and capacitor 82, the capacitor being returned to ground reference terminal 59. The other end of resistor 80 is then coupled through the collector-emitter electrodes of transistor 84 to a summing network 86 which includes resistor 88 which is connected between the collector of transistor 84 and power supply conductor 52. Summing circuit 86 also includes transistor 90 which has its base electrode connected to the collector electrode of transistor 84, its emitter electrode coupled through resistor 92 to ground reference terminal 59 and its collector returned to power supply conductor 52. The common junction point between resistor 88 and the collector of transistor 84 is also connected to the collector electrode of transistor 76 of differential amplifier 74 over lead 94. The base electrode of transistor 76 being connected to the base electrode of transistor 84. A fixed biased potential is applied to the interconnected bases of transistor 76 and transistor 84 at terminal 96 of oscillator 36. A bias potential is applied to the base electrodes of transistor pairs 62 and 64 of differential amplifier 60 from terminal 98 through resistors 100 and 102 respectively. To control the amount of phase shift through phase shifting network 63, a variable voltage control signal is applied at terminal 104 from APC detector 34 (illustrated in FIG. 1) to the base of transistor 78 of differential amplifier 74.

What has been described hereinabove is a 3.58 megahertz oscillator essentially comprised of a first amplifier 60, a variable phase shifting network 63 and crystal 54 which in combination with variable phase shifting network 63 provides the positive feedback necessary to sustain oscillations at 3.58 megahertz. To avoid the aforementioned problems wherein the oscillator may oscillate at the third overtone of crystal 54, capacitor 58 is included in the feedback network to reduce the loop gain thereby preventing oscillations at the third overtone of crystal 54. For example, the loop gain at the fundamental frequency of crystal 54 is approximately three times that of the third overtone of the crystal. Hence, oscillator 36 will have a stable operating frequency centered substantially at the fundamental frequency of crystal 54.

In operation, crystal resonance will be maintained, and therefore, oscillation sustained when the phase of the voltage appearing across capacitor 58 lags the phase of the voltage appearing at the emitter of transistor 90 by 90°. Explanation of the operation of oscillator 36 is explained hereinafter with the aid of the vector diagram of FIG. 3.

For purposes of illustration, the voltage, $V_2$, is assumed to be at the reference phase of 0°. Further make the assumption that crystal 54 is at resonance so that no phase shift occurs in the current therethrough. Thus, $V_2$ is shown in FIG. 3 as being at 0° (base reference). The voltage $V_1$, generated across capacitor 58, will therefore have a phase which lags $V_2$ by 90° because the current flowing through capacitor 58 has a phase of 0° with respect to the current generated through crystal 54. In response to the voltage $V_1$, differential amplifier 60 provides a differential output at the collectors of transistor pairs 62 and 64 respectively, of which the current through the collector-emitter electrode of transistor 62 has a phase of −90° with respect to voltage $V_2$. The current through collector-emitter electrodes of transistor 64 has a phase of +90° relative to voltage $V_2$ and is 180° out of phase with the current supplied through transistor 62. The voltage at the collector of transistor 62 is then effected by the phase shifting network comprising resistor 80 and capacitor 82 such that it has a phase relation of +45° with respect to voltage $V_2$. Thus, the current conducted through resistor 80 has a phase of −135° with respect to voltage, $V_2$. Differential amplifier 74 provides a current through the collector-emitter electrodes of transistor 76 which is in phase with the output current from transistor 64 of differential amplifier 60. Thus, the current conducted through resistor 88 to transistor 76 has a phase relation of +90° with respect to voltage, $V_2$. The current supplied through resistor 88 through the collector-emitter electrodes of transistor 84 has a phase angle of −135° with respect to voltage, $V_2$. Thus, as illustrated by the phase diagrams of FIG. 3, the current through resistor 88 ($I_{88}$) has a component having a phase angle of +90° ($I_{76}$) and a component having a phase angle of −135° ($I_{84}$). These two components are then summed through resistor 88 such that the voltage at the base of transistor 90 is related to the vector sum of the two components ($I_{88}$). By varying the control voltage at terminal 104 (the output from APC phase detector 34) the magnitude $\alpha$, of the current supplied through transistor 76 of differential amplifier 74 can be varied from 0 to a value of 1 with respect to the current supplied through resistor 88 to transistor 84. Hence, the vector sum of these two currents has a phase which can be made to vary from a −135° angle to a +135° angle. Therefore, the voltage applied to the base of transistor 90 varies from +45° to −45°. For example, when oscillator 36 is operating at its fundamental frequency of 3.58 megahertz, the magnitude of the current through transistor 76 is maintained at the same magnitude of the current through transistor 84 ($\alpha=0.5$). Thus, voltage at the base of transistor 90 will have a total phase shift of 0°. As transistor 90 is operated as an emitter follower, the voltage and current appearing across resistor 92 is therefore at a phase of 0°. Hence, the voltage $V_2$ is at the reference phase angle of 0°, as was assumed. Therefore, crystal 54 will be at the resonant frequency desired and oscillation will be maintained by oscillator 36 at the predetermined frequency.

To permit the oscillator to be synchronized to the NTSC reference sync burst, the frequency and phase of the oscillator are controlled by the control voltage from phase detector 34 in the following manner. If transistor 78 is rendered more conductive by a positive control voltage, transistor 76 will be rendered nonconductive ($\alpha=0$). Thus, the current supplied through resistor 88 has a total phase shift of a −135°. On the other hand, if transistor 78 is rendered nonconductive in response to the control voltage, transistor 76 is rendered fully conductive ($\alpha=1$) with the total phase shift of the current through resistor 88 being a +135°. Hence, oscillator 36 is synchronized to the NTSC reference sync burst by having a feedback loop network which introduces varying degrees of phase shift according to the applied control voltage from APC phase detector 34.

The oscillator of FIG. 2 ensures that the oscillator oscillates at or near the fundamental frequency of the crystal. More specifically, because the impedance of capacitor 58 varies inversely with the frequency generated by crystal 54, at higher frequencies and more specifically the third overtone frequency of crystal 54, capacitor 58 has an impedance value which is less than the impedance value at the resonance frequency of the crystal. Therefore, there will be less voltage developed across capacitor 54 at the third overtone frequency. Accordingly, the gain of the amplifier is less at the third overtone frequency. In fact, the magnitude of voltage appearing across capacitor 58 is divided by a factor of three with respect to the magnitude of the voltage developed thereacross at resonance. Hence, the oscillator will oscillate at the fundamental frequency rather than at the third overtone frequency, as is understood in the art.

Referring now to FIG. 4, a preferred embodiment of oscillator 36 is illustrated which is suitable to be manufactured in monolithic integrated circuit form. The same reference numbers are used for components corresponding to like components of FIG. 2. The operation of the circuit of FIG. 4 is identical to that of FIG. 2 and need not be described further.

Oscillator 36 of FIG. 4 is intended to be included in a single monolithic integrated circuit chip comprising APC phase detector 34, hue control 38 and ACC detector 40 and as such has several circuit components added for isolating it from the other circuits. A brief description is sufficient for explanation of these added components. Constant current source 66 of FIG. 2 is illustrated as including transistor 110 which has its collector emitter electrode connected in series with the interconnected emitter electrodes of transistor pair 62 and 64 of differential amplifier 60 with the emitter electrode of transistor 110 coupled to ground reference terminal 59 through resistor 112. Transistors 114 and 116 provide a fixed bias to the base electrode of transistor 110 for providing a constant current to be conducted through transistor 110. Transistor 116 has its collector-emitter electrodes serially connected between plus $V_{cc}$ and ground reference terminal 59 through resistors 118, 120, and 122 respectively. Base current drive is supplied to transistor 114 through resistors 118 and 120, with its emitter electrode connected to the base electrode of transistor 116 and to ground reference terminal 59 through resistor 124. Fixed bias is provided to differential amplifier 60 through transistors 126 and 128 which act as buffer amplifiers, as is understood in the art. The bias voltage is generated across resistor 130 of emitter follower 132 and is coupled to transistors 126 and 128 through resistors 102 and 100, respectively.

The control voltage from APC phase detector 34 is applied to differential amplifier 74 through transistors 136 and 138 which are connected as a Darlington configuration. Darlington emitter transistors 136 and 138 act as an impedance transformer as is known in the art to provide a low impedance at the output of the emitter electrode of transistor 138 (the output of APC phase detector 34 being normally at a high impedance level). The resistor divider circuit comprising resistors 140, 142 and 144 which are connected between the base of transistor 76 and ground reference terminal 59 provide for varying the gain of differential amplifier 74 in response to the control voltage applied at terminal 104. The differential gain of differential amplifier 74 is varied in response to the current conducted through Darlington emitter transistors 136 and 138, the emitter of transistor 138 being connected to the junction point between resistors 142 and 144. The base electrode of transistor 78 being connected to the junction point between resistors 140 and 142. A substantially constant bias potential is developed across resistor 146 which is connected in series between the power supply voltage and ground reference terminal 59 through resistor 148. The second Darlington emitter configuration comprising transistors 150 and 152 are provided for coupling the bias potential developed across resistor 146 to the base of transistor 76 of differential amplifier 74. Therefore, a fixed voltage is developed across resistor 154 which is connected at the junction point of the emitter of transistor 152 and the base of transistor 76 and ground reference terminal 59. Fixed bias is applied to phase shifting network 63 over lead 155.

By way of example, the circuit of FIG. 4 has been built with the values of the resistive components being as follows:

| RESISTOR | VALUE |
| --- | --- |
| 80 | 430 ohms |
| 88 | 1,000 ohms |
| 92 | 4,700 ohms |
| 100 | 10,000 ohms |
| 101 | 5,600 ohms |
| 102 | 10,000 ohms |
| 103 | 5,600 ohms |
| 112 | 275 ohms |
| 118 | 6,000 ohms |
| 120 | 4,000 ohms |
| 122 | 500 ohms |
| 124 | 1,200 ohms |
| 130 | 6,800 ohms |
| 140 | 400 ohms |
| 142 | 4,000 ohms |
| 144 | 8,200 ohms |
| 148 | 3,600 ohms |
| 146 | 8,400 ohms |
| 154 | 8,200 ohms |

What has been described, therefore, is an improved voltage control crystal oscillator circuit which is suitable for manufacture in integrated circuit form. The voltage control crystal oscillator circuit configurations of FIGS. 2 and 4 comprise a novel phase shifting network for varying the phase and frequency of the oscillator to maintain synchronization with the received chrominance signal in a television receiver set. Moreover, the gain of the oscillator circuit is reduced by more than three to one at the third overtone of the crystal thereby suppressing oscillation thereat, which if not suppressed could cause interruption of the reproduction of the color images to the color television tube, such that a viewer would see only a black and white reproduction of the color broadcast signal. The suppression of the third overtone of the crystal by the circuit configurations of FIGS. 2 and 4 is carried out by a simple capacitive component whereas prior art circuits have included third overtone filters. Thus an improved frequency stable oscillator circuit having fewer components has been illustrated which is less expensive than some prior art circuits.

While the above detailed description has shown, described and pointed out the fundamental novel features of the invention comprising the embodiment of the invention, it will be understood that various omissions, substitutions and changes in the form and details of the circuit and method utilized may be made by those skilled in the art without departing from the spirit of the invention. It is the intention, therefore, to be limited only as indicated by the scope of the following claims.

What is claimed is:

1. A voltage controlled oscillator circuit suitable for providing differential output oscillation signals, including in combination:

frequency determining means resonant at a predetermined frequency for generation of an output signal having a reference phase and frequency at an output terminal thereof;

first phase shifting means responsive to said output signal from said frequency determining means for providing a voltage output signal, the phase of said voltage output signal lagging said output signal from said frequency determining means by substantially 90°;

first amplifying means receiving said voltage output signal from said first phase shifting means for providing first and second current signals at first and second output terminals respectively, and the differential output oscillation signals, said first and second current signals being substantially 180° out of phase with respect to each other, the phase of said first output current signal being substantially the same as said voltage output signal from said first phase shifting means;

second amplifying means receiving said second current signal from said first amplifying means for developing a current signal at an output terminal thereof, said current signal having substantially the same phase as said second current signal from said first amplifying means, said second amplifying means including first and second input terminals and a common terminal, said common terminal being adapted to receive said second current signal from said first amplifying means, said second input terminal being adapted to receive a bias potential, and said first input terminal being adapted to receive a control voltage signal, the magnitude of said current signal of said second amplifying means being varied in response to said control voltage signal;

second phase shifting means responsive to said first current signal from said first amplifying means for producing at an output thereof a current signal having a predetermined phase relation to said output voltage signal from said first phase shifting means, said second phase shifting means including a transistor having first, second and control electrodes, said control electrode being coupled to said bias potential, said second electrode being coupled to said output of said second phase shifting means, resistive means, and a capacitor, said resistive means being connected between said first output terminal of said first amplifying means and said first electrode of said transistor, said capacitor being coupled in shunt between said output terminal of said first amplifying means and a ground reference terminal; and summing means for developing an output signal to said frequency determining means in response to said current signals from said second phase shifting means and said second amplifying means, said output signal from said summing means having a phase which is varied over a predetermined range in accordance with the magnitude of said current signal from said second amplifying means being varied in response to said voltage control signal.

2. The voltage controlled oscillator of claim 1 wherein said frequency determining means includes a crystal which is resonant at approximately the mean operating frequency of said oscillator.

3. The voltage controlled oscillator of claim 1 wherein:

said control voltage signal applied to said second amplifying means varies with phase deviation of the voltage controlled oscillator from a reference phase condition to vary the magnitude of the current signal from said second amplifying means thereby changing the phase of said output signal from said summing means to maintain said reference phase condition of said frequency determining means.

4. The voltage controlled oscillator of claim 1 wherein said first amplifying means includes a differential amplifier having first and second input terminals, a common terminal, and first and second output terminals, said first input terminal being connected to said first phase shifting means and being coupled to a bias supply voltage, said second input terminal being coupled to said bias supply voltage, said first and second output terminals being respectively connected to said second phase shifting means and said second amplifying means, and said common terminal being adapted to be connected to a constant current source.

5. The voltage controlled oscillator of claim 4 wherein:

said differential amplifier of said first amplifying means including first and second electron control devices each having first and second electrodes and a control electrode, said first electrodes of said first and second electron control devices being interconnected and connected to said common terminal of said first amplifying means, said second electrode of said first and second electron control devices being said first and second output terminals of said differential amplifier, and said control electrodes of said first and second electron control devices being said first and second input terminals of said differential amplifier respectively.

6. The voltage controlled oscillator of claim 5 wherein said second amplifying means includes:

an additional differential amplifier comprising first and second electron control devices each having a control electrode, a first and a second electrode, said first electrode of said first and second electron control devices being interconnected to said common terminal of said second amplifying means, said control electrode of said first electron control device of said additional differential amplifier being adapted to receive said voltage control signal, said second electrode of said first electron control device being coupled to a power supply, said control electrode of said second electron control device of said additional differential amplifier being adapted to receive said bias potential, and said second electrode of said second electron control device of said additional differential amplifier being connected to said output terminal of the second amplifying means.

7. The voltage controlled oscillator of claim 6 wherein said summing means includes:

second resistive means having first and second terminals, said first terminal being connected to said output terminal of said second amplifying means and to said output terminal of said second phase shifting means, said second terminal being coupled to said power supply;

electron control means having first and second electrodes and a control electrode, said control electrode being connected to said first terminal of said second resistive means, said second electrode being coupled to said power supply and said first electrode being adapted to provide said output signal; and third resistive means having a first and second terminal, said first terminal being connected to said first electrode of said second electron control means, and said second terminal being connected to said ground reference terminal.

8. In a television receiver, an oscillator suitable to be built in monolithic integrated form having first and second terminals, the oscillator including a positive feedback path which is responsive to a voltage control signal for varying the phase of a signal through the feedback path to vary the phase and frequency of the oscillator about the mean operating frequency of the oscillator and including a frequency determining circuit which is resonant at the frequency of the oscillator for providing an output reference signal, the frequency determining circuit having an input and output terminal which are adapted to be connected, respectively, to the first and second terminals of the oscillator; including in combination:

the frequency determining circuit further including phase shifting means for developing a voltage signal in response to said output reference signal, said voltage signal having a phase which lags the phase of the said output reference signal by substantially 90°, said phase shifting means being adapted to be connected to the second terminal of the oscillator;

first amplifying means responsive to said phase shifting means for developing first and second current signals at first and second outputs respectively, said first current signal being in phase with said voltage signal from said phase shifting means, said second current signal being 180° out of phase with said first current signal, and said amplifying means developing oscillation signals at output terminals thereof;

second amplifying means responsive to said second current signal from said first amplifying means and to the control voltage for varying the magnitude of said second current signal appearing at the output terminal thereof, said second amplifier being adapted to receive a first bias potential;

first electron control means having first, second and control electrodes, said control electrode being adapted to receive said bias potential;

resistive means coupled between said first electrode of said first electron control means and said first output of said first amplifying means;

said first output of said first amplifying means being adapted to be connected to a capacitor;

said first electron control means, resistive means and said capacitor producing predetermined phase shift to said first current signal with respect to said second current signal appearing at said output of said second amplifying means; and summing means operatively coupled to said output of said second amplifying means and said second electrode of said first electron control means for producing a variable phase signal at the first terminal of the oscillator in response to variations in the magnitude of the control voltage.

9. The monolithic integrated oscillator of claim 8 wherein said first amplifying means includes:

a first differential amplifier having first and second input terminals, first and second output terminals and a common terminal, said first and second input terminals respectively being adapted to be coupled to the output terminals of the oscillator;

current source means having an input terminal and first and second terminals, said input terminal being coupled to a power supply, said first terminal being connected to said common terminal of said first differential amplifier, said second terminal being adapted to be connected to a ground reference terminal, means for deriving a second bias potential;

first circuit means for coupling said first input terminal of said first differential amplifier to said second bias potential and to said first phase shifting means; and second circuit means for coupling said second input terminal of said first differential amplifying means to said second bias potential.

10. The monolithic integrated oscillator of claim 9 wherein said second amplifying means includes:

a second differential amplifier having first and second input terminals, at least one output terminal, and a common terminal, said common terminal being coupled to said second output of said first amplifying means, said at least one output terminal being said output terminal of said second amplifying means, said second input terminal being coupled to said first bias potential; and third circuit means for coupling said first input terminal of said second differential amplifying means to the voltage control signal.

11. The monolithic integrated circuit of claim 10 wherein said summing means includes:

second resistive means having a first and a second terminal, said first terminal being coupled to said power supply, and said second terminal being adapted to be connected to said second electrode of said first electron control means and to said output terminal of said second amplifying means;

second electron control means having a first and a second electrode and a control electrode, said control electrode being connected to said second terminal of said second resistive means, said second electrode being coupled to said power supply, and said first electrode being adapted to be connected to the first terminal of the oscillator; and third resistive means having a first and second terminal said first terminal being connected to said first electrode of said second electron control means, and said second terminal being connected to said ground reference terminal.

* * * * *